United States Patent
Daubenspeck et al.

(10) Patent No.: US 8,927,869 B2
(45) Date of Patent: Jan. 6, 2015

(54) SEMICONDUCTOR STRUCTURES AND METHODS OF MANUFACTURE

(75) Inventors: Timothy H. Daubenspeck, Colchester, VT (US); Jeffrey P. Gambino, Westford, VT (US); Zhong-Xiang He, Essex Junction, VT (US); Christopher D. Muzzy, Burlington, VT (US); Wolfgang Sauter, Hinesburg, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 300 days.

(21) Appl. No.: 13/444,343

(22) Filed: Apr. 11, 2012

(65) Prior Publication Data

US 2013/0269974 A1    Oct. 17, 2013

(51) Int. Cl.
*H05K 1/00*    (2006.01)

(52) U.S. Cl.
USPC ........... 174/250; 427/250; 257/360; 257/499; 257/621; 257/758; 438/623; 438/627; 438/737; 438/692

(58) Field of Classification Search
USPC ........... 174/250; 427/250; 257/360, 499, 621, 257/758; 438/623, 627, 737, 692
See application file for complete search history.

(56) References Cited

U.S. PATENT DOCUMENTS

| | | | |
|---|---|---|---|
| 4,447,824 A | 5/1984 | Logan et al. | |
| 5,679,982 A * | 10/1997 | Gardner | 257/758 |
| 5,783,483 A * | 7/1998 | Gardner | 438/627 |
| 6,004,874 A | 12/1999 | Cleeves | |
| 6,123,992 A * | 9/2000 | Sugai | 427/250 |
| 6,319,822 B1 * | 11/2001 | Chen et al. | 438/637 |
| 6,452,274 B1 * | 9/2002 | Hasegawa et al. | 257/758 |
| 6,506,680 B1 * | 1/2003 | Kim et al. | 438/692 |
| 6,624,063 B2 * | 9/2003 | Hasegawa et al. | 438/623 |
| 6,797,605 B2 | 9/2004 | Goh et al. | |
| 7,892,974 B2 * | 2/2011 | Ring et al. | 438/675 |
| 2001/0049195 A1 | 12/2001 | Chooi et al. | |
| 2006/0263727 A1 * | 11/2006 | Lee et al. | 430/311 |
| 2007/0045746 A1 * | 3/2007 | Sunohara et al. | 257/360 |
| 2007/0120216 A1 * | 5/2007 | Brigante et al. | 257/499 |
| 2008/0121943 A1 * | 5/2008 | Lin et al. | 257/211 |
| 2008/0290520 A1 * | 11/2008 | Lin et al. | 257/758 |
| 2009/0104769 A1 * | 4/2009 | Lee et al. | 438/653 |
| 2010/0224966 A1 * | 9/2010 | Chen | 257/621 |
| 2013/0114924 A1 * | 5/2013 | Loh et al. | 385/14 |

* cited by examiner

*Primary Examiner* — Xiaoliang Chen

(74) *Attorney, Agent, or Firm* — David Cain; Roberts Mlotkowski Safran & Cole, P.C.

(57) ABSTRACT

Wire-bonded semiconductor structures using organic insulating material and methods of manufacture are disclosed. The method includes forming a metal wiring layer in an organic insulator layer. The method further includes forming a protective layer over the organic insulator layer. The method further includes forming a via in the organic insulator layer over the metal wiring layer. The method further includes depositing a metal layer in the via and on the protective layer. The method further includes patterning the metal layer with an etch chemistry that is damaging to the organic insulator layer.

8 Claims, 5 Drawing Sheets

SEMICONDUCTOR STRUCTURES AND METHODS OF MANUFACTURE

FIELD OF THE INVENTION

The invention relates to semiconductor structures and methods of manufacture and, more particularly, to wire-bonded semiconductor structures using organic insulating material and methods of manufacture.

BACKGROUND

Semiconductors are widely used in integrated circuits for a variety of electronic devices such as, e.g., smart phones, tablets as well as small and large scale (e.g., servers) computing devices. These integrated circuits typically combine many structures on a wafer to perform complex functions and store data. For example, these structures can be wiring structures, inductors, capacitors, transistors, etc. However, the need to integrate more functions onto a chip has caused the semiconductor industry to search for ways to shrink, or scale, the size of individual structures commonly integrated on a chip.

However, scaling devices to smaller dimensions can create a multitude of undesirable effects. One of these effects is an increase in the capacitive coupling between devices or to an underlying semiconductor substrate of a circuit, since the capacitive coupling is inversely proportional to the distance between the such devices or structures. This coupling may limit the ultimate speed of the device or otherwise inhibit proper device operation, if steps are not taken to reduce the coupling. The capacitance between conductors is also highly dependent on the insulator, or dielectric, used to separate the structures. Conventional semiconductor fabrication commonly employs silicon dioxide as a dielectric, which has a dielectric constant of about 3.9. However, such dielectric materials exhibit high capacitance coupling.

Accordingly, there exists a need in the art to overcome the deficiencies and limitations described hereinabove.

BRIEF SUMMARY

In a first aspect of the invention, a method comprises forming a metal wiring layer in an organic insulator layer. The method further comprises forming a protective layer over the organic insulator layer. The method further comprises forming a via in the organic insulator layer over the metal wiring layer. The method further comprises depositing a metal layer in the via and on the protective layer. The method further comprises patterning the metal layer with an etch chemistry that is damaging to the organic insulator layer.

In another aspect of the invention, a method comprises forming an organic insulator layer on an underlying substrate, using a spin on technique. The method further comprises forming a wiring layer in a patterned section of the organic insulator layer using an electroplating process. The method further comprises forming a protective layer over the organic insulator layer. The method further comprises forming a via in the organic insulator layer using an etching chemistry that minimizes damage to the organic insulator layer, the via being in alignment with the wiring layer. The method further comprises depositing an Al layer in the via and on the protective layer. The method further comprises patterning the Al layer with a chlorine etch chemistry to form at least a bond structure. The method further comprises forming an insulating layer over the bond structure, and forming a via structure to the patterned metal layer.

In yet another aspect of the invention, a structure comprises a structure comprises a patterned Al wire-bond structure provided over an organic insulator layer, with a protective layer provided therebetween in direct contact with both the Al wire-bond structure and the organic insulator layer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structure, which comprises the structures of the present invention. In still further embodiments, a method in a computer-aided design system is provided for generating a functional design model of the semiconductor structure. The method comprises generating a functional representation of the structural elements of the semiconductor structure.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to semiconductor structures and methods of manufacture and, more particularly, to wire-bonded semiconductor structures using organic insulating material and methods of manufacture. More specifically, the wire-bonded semiconductor structures of the present invention comprise an aluminum (Al) layer, deposited over an organic insulating material. The organic insulating material can be, for example, polyimide, BCB (Benzocyclobutene) or PBO (polybenzoxazole). The organic insulating material can be applied using conventional spin-on techniques, which eliminates the need for subsequent planarization processes needed with other dielectric materials, thus considerably reducing fabricating costs. Also, advantageously, the organic insulating material minimizes the capacitive coupling to the substrate.

To achieve Al wiring pitches of 5 microns or less, it is desirable to use reactive ion etching (RIE) processes for the Al patterning. However, Al RIE is known to damage the underlying polymer dielectric (i.e., organic insulating material). Hence, the present invention provides a method for patterning Al by RIE over organic insulating materials without causing any damage to the organic insulating material. More specifically, in embodiments, an etch stop (e.g., protective layer) is deposited over the organic insulating material, prior to via formation for the Al wiring level. In embodiments, the protective layer can be deposited within the via. The protective layer can be insulator material or conductor material. In either scenario, the use of a protective layer allows for more flexibility in building the structures of the present invention, compared to conventionally known processes. When the conductor material is used, it is removed after the resist strip for the Al. However, the removal process uses, e.g., fluorine based RIB, which minimizes any damage to the underlying organic insulating material.

Figure 1:
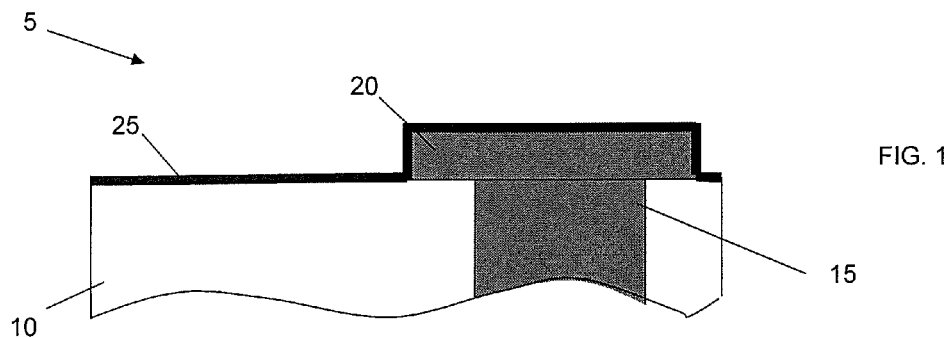
FIGS. 1-4 show processing steps and respective structures in accordance with aspects of the present invention.

FIG. 1 shows processing steps and a respective structure in accordance with aspects of the present invention. More specifically, FIG. 1 shows a structure 5 comprising a substrate 10. In embodiments, the substrate 10 can be any insulator material, provided at a wiring level of the structure 5. For example, by way of an illustrative, non-limiting example, the substrate can be $SiO_2$, although other insulator materials are also contemplated by the present invention. The structure can be implemented with BULK silicon or silicon on insulator (SOI) implementations.

A wiring 15 is formed in the substrate 10, using any conventional additive or subtractive processes, known to those of skill in the art and described in more detail below. The wiring 15 can be electrically connected to underlying wirings, contacts and/or devices, as should be understood by those of skill in the art. The wiring 15 can be a copper or other wiring material such as, for example, Al, tungsten, or other metals or metal alloys.

In embodiments, the wiring 15 can be formed by either an additive process or subtractive process. By way of example, in embodiments, metal or metal alloy can be deposited in a pattern (opening) conventionally formed in the substrate 10, using chemical vapor deposition (CVD) processes. After deposition, the metal or metal alloy can then undergo a planarization process. In a subtractive process, on the other hand, the metal or metal alloy can first be blanket deposited on an underlying insulator material, i.e., substrate. The metal or metal alloy is then patterned using conventional lithographic and etching processes, known to those of skill in the art. After patterning of the wiring 15, the substrate 10 can be formed, e.g., deposited, and planarized.

Still referring to FIG. 1, an upper wiring layer 20 is formed in electrical contact with the wiring 15. In embodiments, the upper wiring layer 20 can be formed using an additive or subtractive process. In preferred embodiments, though, the upper wiring layer 20 is formed by an electroplating process. For example, a seed layer can be deposited on the substrate 10 and exposed portions of the wiring 15 using conventional deposition processes. In embodiments, the seed layer can be about 1000 Å; although other thicknesses are contemplated by the present invention. After seeding, a resist is formed on the seed layer, and then patterned using conventional lithographic processes. The upper wiring layer 20 is then formed by an electroplating process, on the exposed seed layer. In embodiments, the upper wiring layer 20 and the seed layer are copper. After the upper wiring layer 20 is formed, the resist layer can be removed using a conventional oxygen ashing process. The seed layer is then removed with a wet etch, to provide isolation between the wires in layer 20. In optional embodiments, the upper wiring layer 20 can also be planarized using conventional chemical mechanical polishing (CMP) processes.

A layer 25 of SiN or $SiO_2$ can be deposited on the upper wiring layer 20 and any exposed portions of the substrate 10. The layer 25 can be formed using any conventional deposition processes such as, for example, CVD. The layer 25 can be formed to a thickness of about 1000 Å; although other dimensions are contemplated by the present invention.

Figure 2:
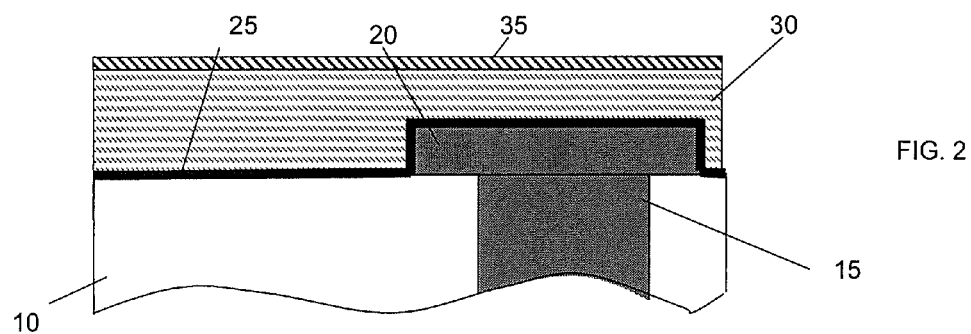

In FIG. 2, an organic layer 30 is formed over the upper wiring layer 20 and the layer 25. In embodiments, the organic layer 30 is polyimide, BCB (Benzocyclobutene) or PBO (polybenzoxazole); although other organic insulator materials are also contemplated by the present invention. In embodiments, the organic layer 30 is formed using a spin-on technique, which eliminates the need for subsequent planarization processes. In embodiments, the organic layer 30 is thicker than the upper wiring layer 20. For example, in embodiments, the organic layer 30 can be greater than 6 microns; although other dimensions are also contemplated by the present invention. It optional embodiments, it should be understood that the upper wiring layer 20 can be formed after formation of the organic layer 30 using a damascene process.

A protective layer 35 (e.g., etch stop layer) is formed over the organic layer 30. In embodiments, the protective layer 35 is $SiO_2$; although other protective materials are also contemplated by the present invention, e.g., SiN or other materials that can be selective to Al and removed with, e.g., a fluorine based etch or other etch that will minimize any damage to the underlying organic layer 30. In embodiments, the protective layer 35 can be deposited using conventional CVD processes to a thickness of about 1000 Å to about 0.5 microns.

Figure 3:
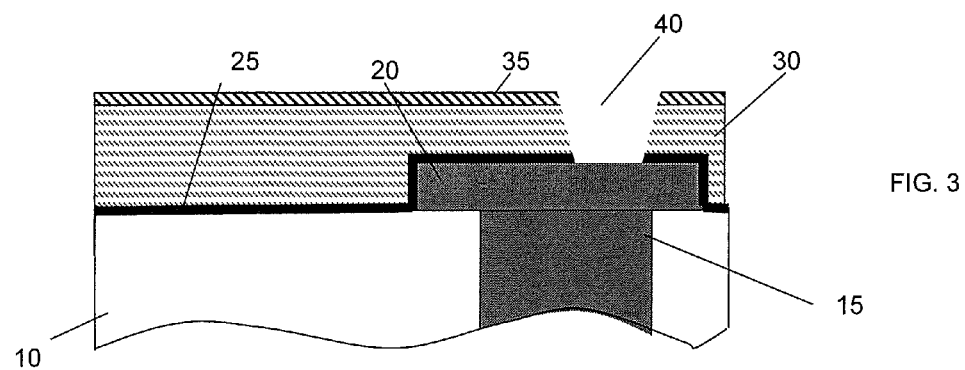

In FIG. 3, a via 40 is formed in the organic layer 30 to the underlying upper wiring layer 20. In embodiments, the via 40 can be formed using conventional lithographic and etching processes. For example, a fluorine-based etch followed by an oxygen-based etch, can be used to form the via 40, through the protective layer 35, organic layer 30 and layer 25. More specifically, a resist can be formed over the protective layer 35, and exposed to energy to form a pattern (opening) therein. A conventional fluorine-based RIE process can then be used to etch inorganic layer 35, followed by an oxygen-based RIE process to etch organic layer 30, thereby forming the via 40. The fluorine based RIE process will not unduly damage the organic layer 30. The resist can then be removed using a conventional oxygen ashing process.

Figure 4:
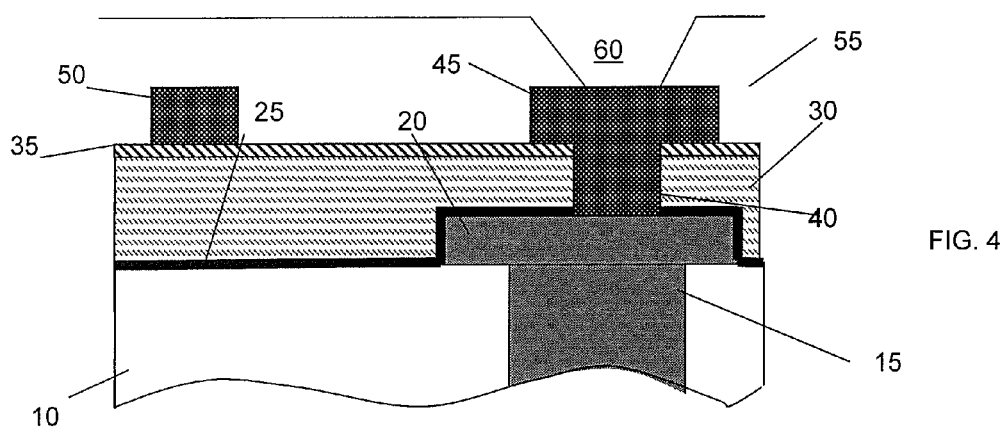

In FIG. 4, Al is deposited in the via 40 and over the protective layer 35. The Al can be formed by a blanket sputter deposition or by a CVD process, for example. After deposition of the Al layer, a wire-bond structure 45 and wiring layer 50 are patterned using conventional chlorine based RIE processes. The conventional chlorine based RIE processes, though, will not attack the underlying organic layer 30 due to the protection provided by the protective layer 35. An insulator material, e.g., organic layer, 55 can then be formed over the structures 45 and 50, and a via 60 can be formed in the insulator material 55 to the Al wire-bond structure 45. Preferably, the insulator material 55 is a photosensitive polyimide, in order to eliminate the need for resist processing to form the via 60.

Figure 5:
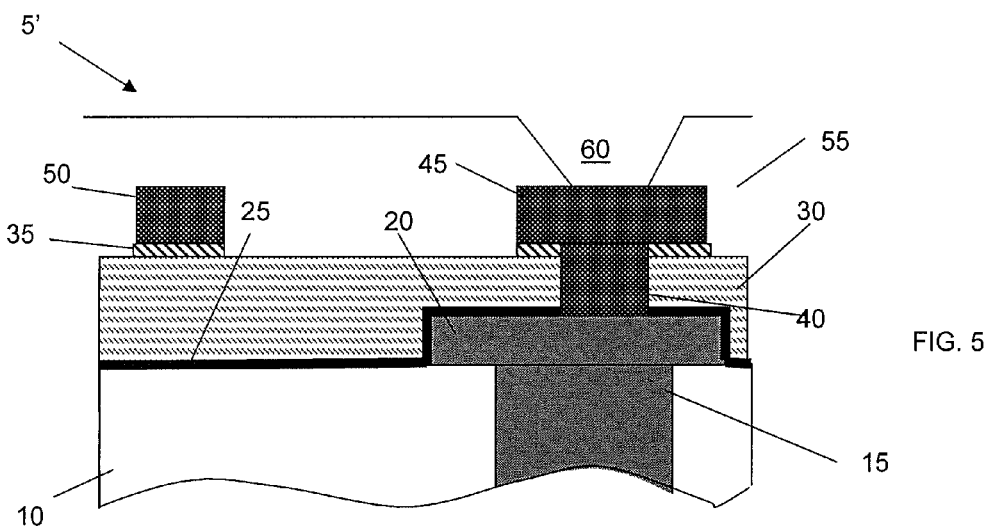
FIG. 5 shows processing steps and an alternative structure in accordance with aspects of the present invention.

FIG. 5 shows an alternative structure in accordance with aspects of the present invention. Specifically, in the structure 5' of FIG. 5, the exposed portions of the protective layer 35 can be removed prior to the formation of the insulator material 55. In embodiments, exposed portions of the protective layer 35 can be removed using a fluorine based RIE process, which will minimize damage to the underlying organic layer 30. The removal of the protective layer 35 can minimize capacitance of the structure 5'.

Figure 6:
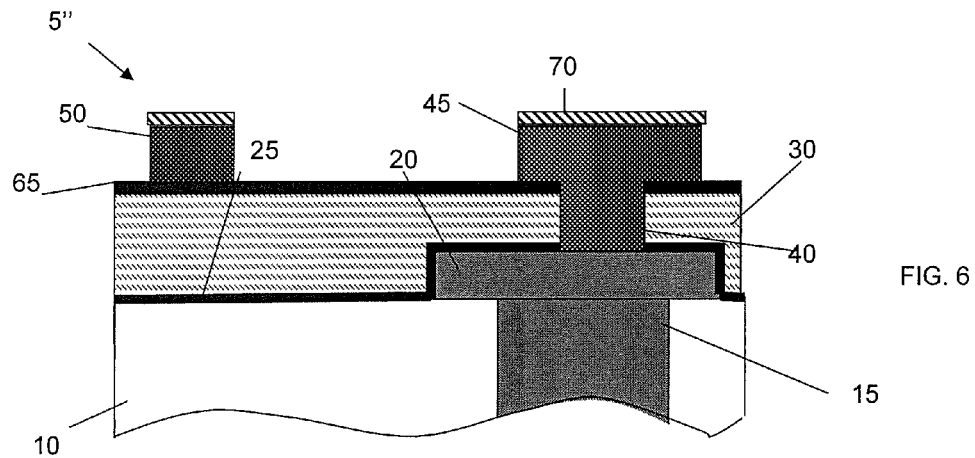
FIGS. 6 and 7 show processing steps and respective alternative structures in accordance with aspects of the present invention.
Figure 7:
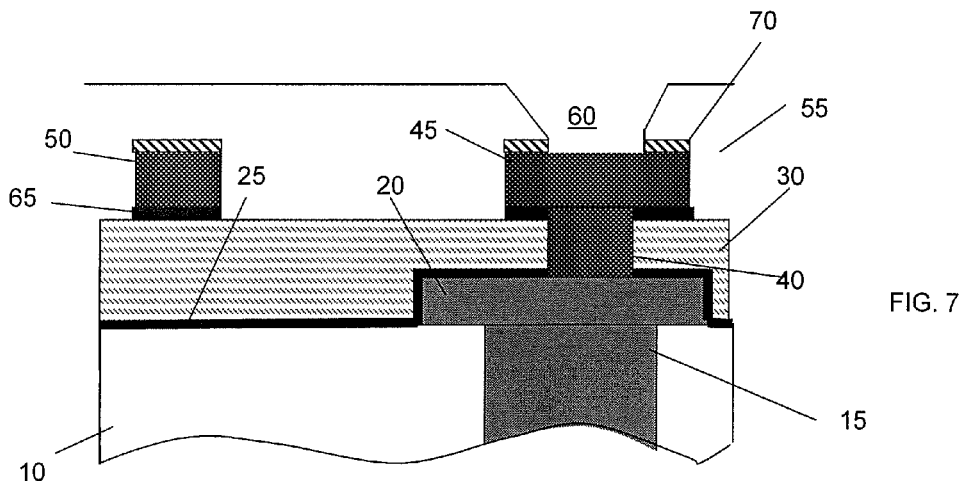

FIGS. 6 and 7 show processing steps to form an alternative structure in accordance with aspects of the present invention. More specifically, in FIG. 6, the structure 5" includes a protective metal layer 65, which substitutes for the protective layer 35. In this embodiment, the protective metal layer 65 can be, for example, TaN, TiN or W; although other metal or metal alloy layers are also contemplated by the present invention (which can be removed with chemistries that will minimize any damage to the underlying organic layer 30). In embodiments, the protective metal layer 65 is formed by a conventional deposition process, e.g., sputter deposition, CVD, or atomic layer deposition (ALD) processes to a thickness of about 1000 Å to about 0.5 microns. In addition, prior to the patterning of the Al layer to form the structures 45 and 50, a dielectric layer 70 is deposited on the Al layer. The dielectric layer 70 can be, for example, an anti-reflective coating material such as silicon oxynitride, SiON. In embodiments, the dielectric layer 70 will act as a protective layer for the Al layer, during subsequent etching of the protective metal layer 65. The structures 45 and 50 can then be patterned using processes as described herein.

In FIG. 7, after the patterning of the wire-bond structure 45 and wiring layer 50 using, e.g., conventional chlorine based RIE processes, the exposed portions of the protective metal layer 65 can be removed using, for example, a fluorine based etch chemistry. As described above, the fluorine based RIE process will minimize any damage to the underlying organic layer 30. The insulator material, e.g., an organic layer, 55 can then be formed over the patterns 45 and 50, and the via 60 formed to the Al wire-bond structure 45. Preferably, the insulator material 55 is a photosensitive polyimide, in order to eliminate the need for resist processing to form the via 60. In the formation of the via 60, the etching process will remove portions of the dielectric layer 70, over the Al wire-bond structure 45.

Figure 8:
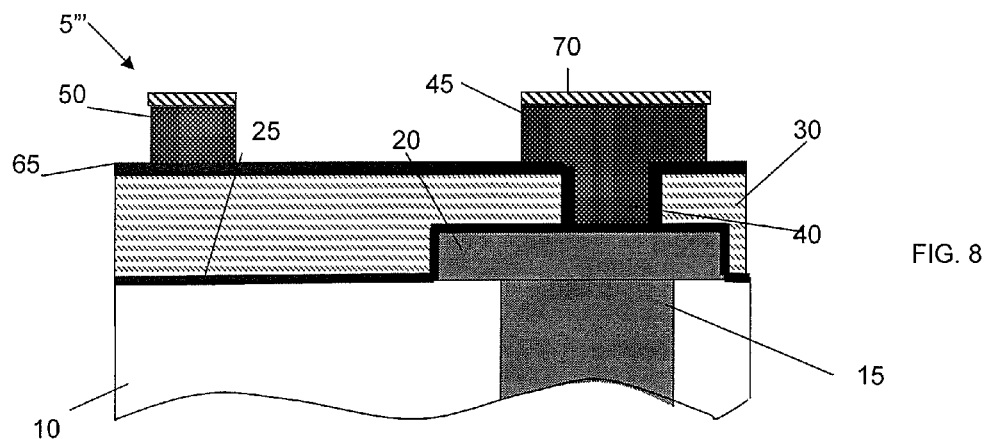
FIGS. 8 and 9 show processing steps and respective alternative structures in accordance with aspects of the present invention.
Figure 9:
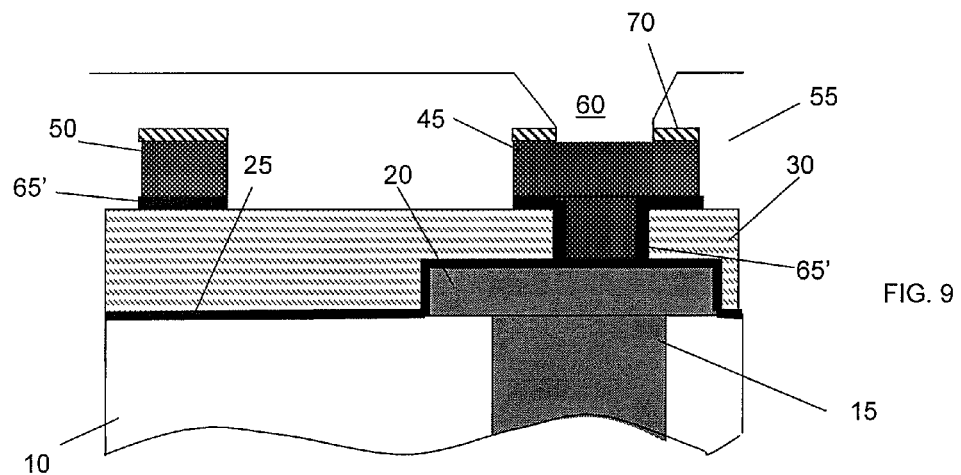

FIGS. 8 and 9 show processing steps to form an alternative structure in accordance with aspects of the present invention. More specifically, in FIG. 8, the structure 5''' includes a protective metal layer 65' formed within the via 40. In this embodiment, the protective metal layer 65' can be, for example, TaN, TiN or W; although other metal or metal alloy layers are also contemplated by the present invention. In embodiments, the protective metal layer 65' is formed by a conventional deposition process, e.g., sputter deposition, CVD or atomic layer deposition (ALD) processes, and can be deposited to a thickness of about 1000 Å to about 0.5 microns. The protective metal layer 65' can be formed in two stages, i.e., a blanket deposition prior to the formation of the via, and then after via formation, a second deposition process. Alternatively, the protective metal layer 65' can be entirely formed after via formation, provided that the etch chemistry used for the via formation does not damage the organic insulator layer 30.

In any of these above scenarios, the Al layer is then deposited over the protective metal layer 65', including with the via 40. Prior to the patterning of the Al layer, as in the embodiments shown in FIGS. 6 and 7, the dielectric layer 70 is deposited on the Al layer. The dielectric layer 70 can be, for example, an anti-reflective coating material such as SiON. In embodiments, the dielectric layer 70 will act as a protective layer during subsequent etching of the protective metal layer 65'. The structures 45 and 50 can then be patterned as already described herein.

In FIG. 9, after the patterning of the wire-bond structure 45 and wiring layer 50 using, e.g., conventional chlorine based RIE processes, the exposed portions of the protective metal layer 65' can be removed using, for example, a fluorine based etch chemistry. As described above, the fluorine based RIE process will minimize any damage to the underlying organic layer 30. The insulator material 55, e.g., a photosensitive polyimide, can then be formed over the patterns 45 and 50, and the via 60 formed to the Al wire-bond structure 45, as described above. In the formation of the via, the etching process will remove portions of the dielectric layer 70, over the Al wire-bond structure 45.

Figure 10:
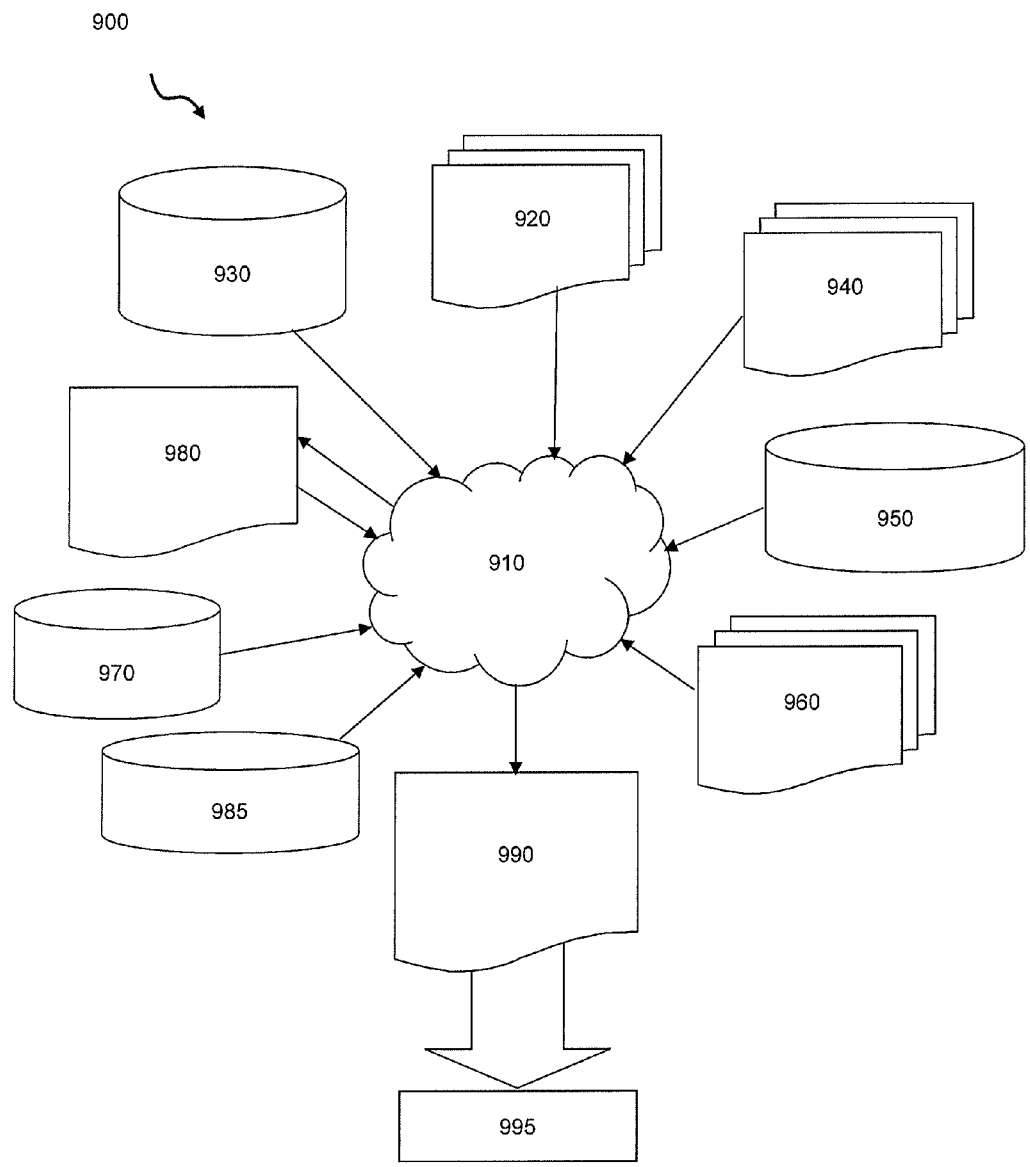
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 990 may comprise a compiled, executable HDL simulation model that functionally simulates the devices shown in FIGS. 1-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   forming a metal wiring layer in an organic insulator layer;
   forming a protective layer over the organic insulator layer;
   forming a via in the organic insulator layer over the metal wiring layer;
   depositing a metal layer in the via and on the protective layer; and
   patterning the metal layer with an etch chemistry that is damaging to the organic insulator layer,
   wherein the metal layer is Al and the patterning is performed using a chlorine based reactive ion etching process;
   the metal wiring layer is formed by an electroplating process within a via of an underlying insulator layer;
   a layer is formed over the metal wiring layer, and under the organic insulator layer;
   the Al layer is formed by a blanket deposition process; and
   the forming of the via exposes the metal wiring layer.

2. The method of claim 1, wherein the organic insulator layer is one of polyimide, BCB (Benzocyclobutene) and PBO (polybenzoxazole).

3. The method of claim 1, further comprising removing exposed portions of the protective layer after the patterning.

4. The method of claim 3, wherein the removing of the exposed portions of the protective layer is a fluorine based etching process that minimizes damage to the organic insulator layer.

5. The method of claim 4, wherein the protective layer is a metal or metal alloy, which has exposed regions which are removed after the patterning of the metal layer.

6. The method of claim 1, wherein the protective layer is $SiO_2$ or SiN.

7. A method, comprising:
    forming a metal wiring layer in an organic insulator layer;
    forming a protective layer over the organic insulator layer;
    forming a via in the organic insulator layer over the metal wiring layer;
    depositing a metal layer in the via and on the protective layer;
    patterning the metal layer with an etch chemistry that is damaging to the organic insulator layer; and
    removing exposed portions of the protective layer after the patterning, wherein:
    the removing of the exposed portions of the protective layer is a fluorine based etching process that minimizes damage to the organic insulator layer;
    the protective layer is a metal or metal alloy, which has exposed regions which are removed after the patterning of the metal layer; and
    the metal or metal alloy is one of TaN, TiN and W.

8. The method of claim 7, wherein the protective layer is formed in the via.

* * * * *